United States Patent
Pop

(10) Patent No.: US 11,429,771 B2
(45) Date of Patent: Aug. 30, 2022

(54) HARDWARE-IMPLEMENTED ARGMAX LAYER

(71) Applicant: FotoNation Limited, Galway (IE)

(72) Inventor: Tudor Mihail Pop, Bucharest (RO)

(73) Assignee: FotoNation Limited, Galway (IE)

(*) Notice: Subject to any disclaimer, the term of this patent is extended or adjusted under 35 U.S.C. 154(b) by 391 days.

(21) Appl. No.: 16/778,525

(22) Filed: Jan. 31, 2020

(65) Prior Publication Data

US 2021/0240895 A1 Aug. 5, 2021

(51) Int. Cl.
*G06F 30/331* (2020.01)
*G06T 7/33* (2017.01)
*G06F 7/483* (2006.01)
*G06K 9/62* (2022.01)

(52) U.S. Cl.
CPC ............ *G06F 30/331* (2020.01); *G06F 7/483* (2013.01); *G06K 9/624* (2013.01); *G06T 7/33* (2017.01); *G06T 2207/20084* (2013.01)

(58) Field of Classification Search
None
See application file for complete search history.

(56) References Cited

U.S. PATENT DOCUMENTS

| | | | |
|---|---|---|---|
| 10,380,753 B1* | 8/2019 | Csordás | G06N 3/08 |
| 10,424,087 B2* | 9/2019 | Risser | G06T 11/00 |
| 10,535,162 B2* | 1/2020 | Laroche | G06T 9/20 |
| 11,176,589 B2* | 11/2021 | Pyati | G06N 20/00 |
| 2018/0189982 A1* | 7/2018 | Laroche | G06T 9/20 |
| 2019/0311301 A1* | 10/2019 | Pyati | G06Q 30/0202 |
| 2020/0394458 A1* | 12/2020 | Yu | G06V 10/25 |
| 2021/0012514 A1* | 1/2021 | Piat | G06K 9/6232 |
| 2021/0192687 A1* | 6/2021 | Liu | G06N 3/084 |
| 2022/0027129 A1* | 1/2022 | Ramesh | G06F 5/012 |
| 2022/0066960 A1* | 3/2022 | Park | G06F 13/1668 |
| 2022/0108127 A1* | 4/2022 | Choi | G06V 10/758 |

* cited by examiner

*Primary Examiner* — Anand P Bhatnagar
(74) *Attorney, Agent, or Firm* — Lee & Hayes, P.C.

(57) ABSTRACT

A hardware acceleration module may generate a channel-wise argmax map using a predefined set of hardware-implemented operations. In some examples, a hardware acceleration module may receive a set of feature maps for different image channels. The hardware acceleration module may execute a sequence of hardware operations, including a portion(s) of hardware for executing a convolution, rectified linear unit (ReLU) activation, and/or layer concatenation, to determine a maximum channel feature value and/or argument maxima (argmax) value for a set of associated locations within the feature maps. An argmax map may be generated based at least in part on the argument maximum for a set of associated locations.

20 Claims, 7 Drawing Sheets

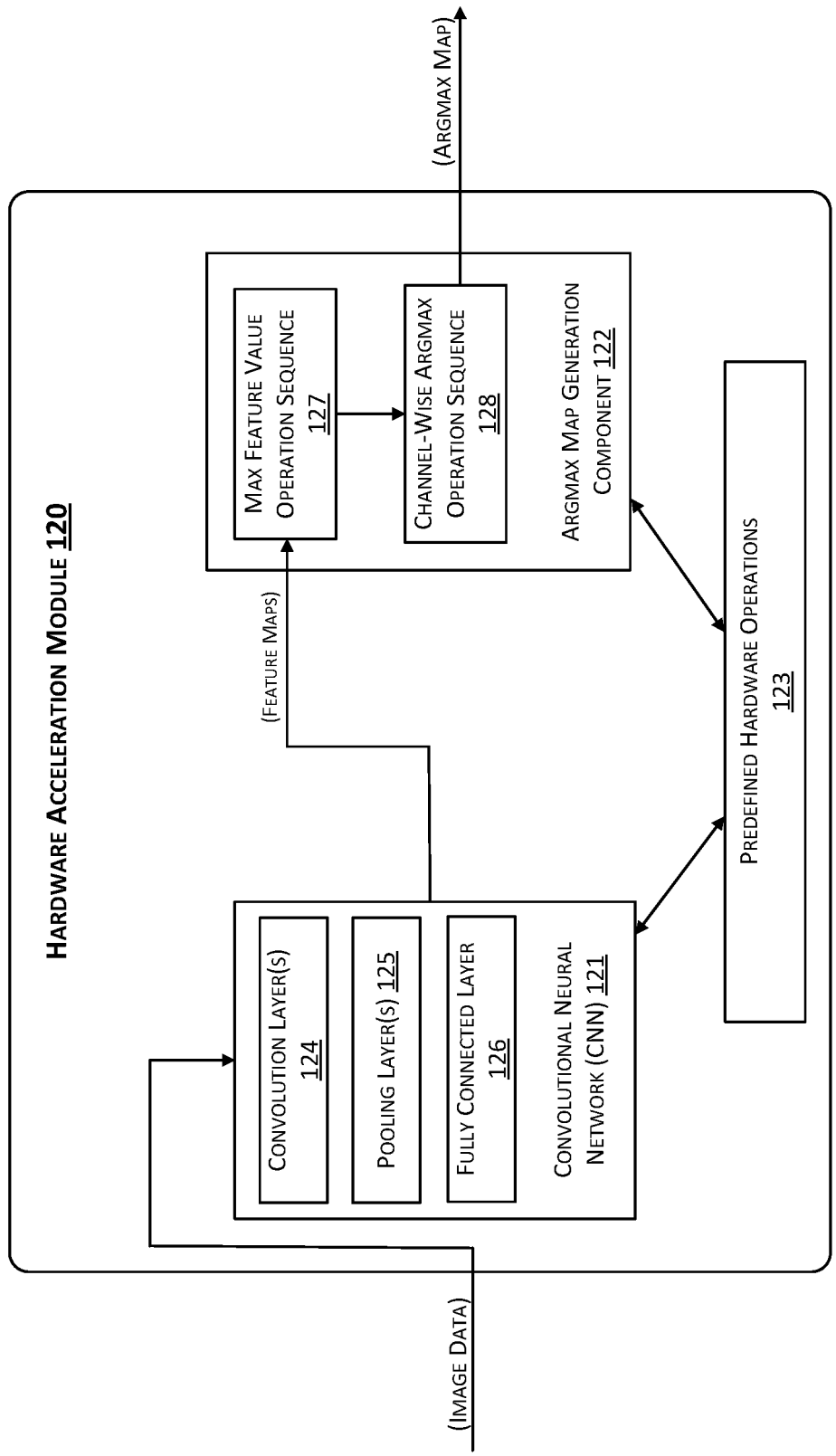

HARDWARE-IMPLEMENTED ARGMAX LAYER

BACKGROUND

Computer vision and image processing play critical roles in many technologies operating across different fields and industries. Technologies such as visual event detection and surveillance, medical image analysis, and automated manufacturing processes, to name only a few, may rely on image processing techniques such as object recognition, feature extraction, segmentation, motion analysis, and image restoration.

However, as modern imaging systems capture and provide larger amounts of higher quality image data, including large and high-resolution images and high frame rate video data, implementing these computer vision and image processing techniques may become computationally expensive and/or time-consuming, preventing real-time processing and/or processing on devices having lower power and/or lower processing speeds. To address these challenges, computer vision and imaging processing systems may include additional and/or dedicated hardware resources (e.g., processors and memory), and image processing algorithms specifically designed to perform the desired functionality of the computer vision and image processing systems.

BRIEF DESCRIPTION OF THE DRAWINGS

The detailed description is described with reference to the accompanying figures. In the figures, the left-most digit(s) of a reference number identify the figure in which the reference number first appears. The same reference numbers in different figures indicate similar or identical items.

FIG. 2 illustrates a block diagram of an example architecture of a hardware acceleration module including a convolutional neural network (CNN) and an argmax component.

DETAILED DESCRIPTION

Figure 1:
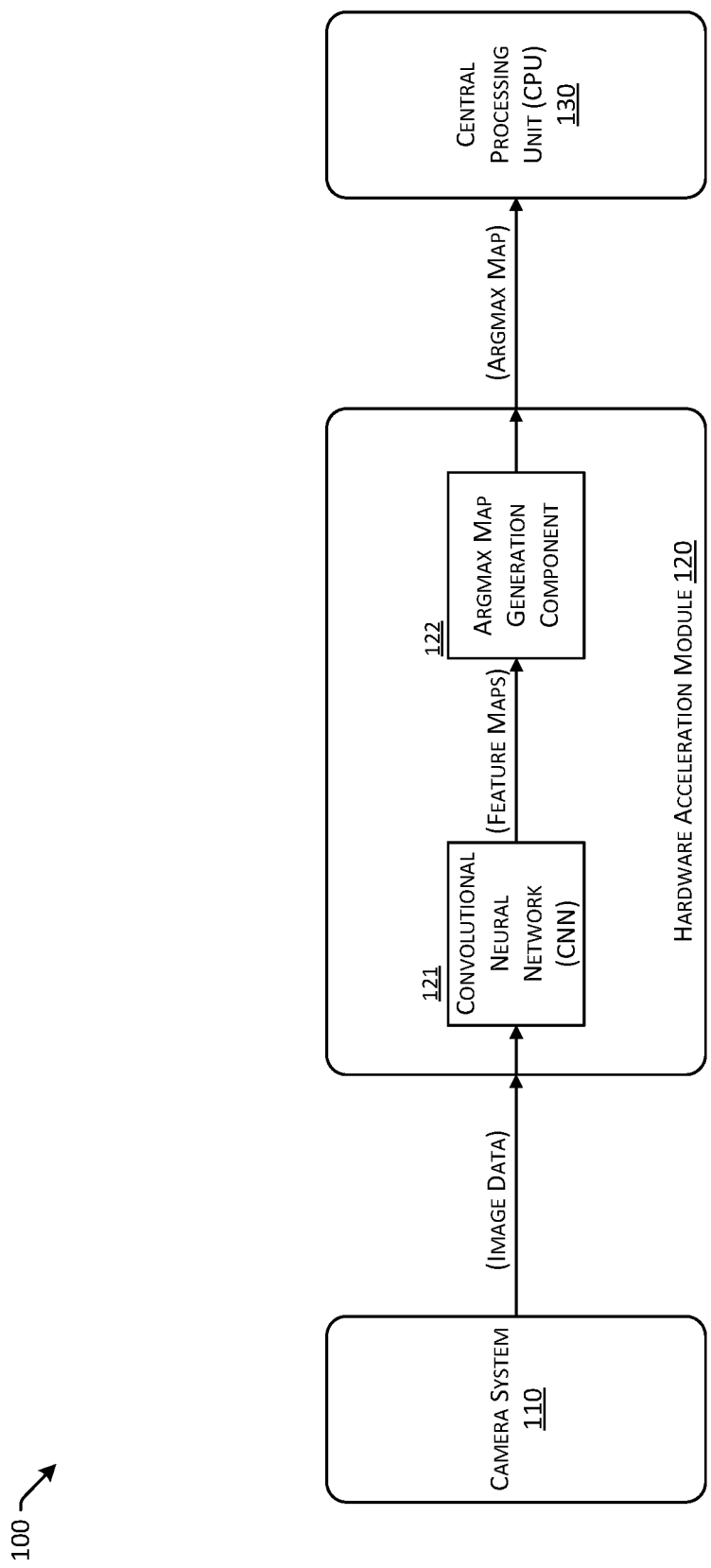
FIG. 1 illustrates a block diagram of an example architecture of an image processing system including a hardware acceleration module and a central processing unit (CPU).

Computer vision and image processing systems may be implemented within a wide variety of computing architectures, using various configurations of data processing hardware, storage systems and network devices. Additionally, advanced image processing systems have been developed which use various types of data structures and software algorithms, including machine-learning techniques, to perform image processing tasks. For example, deep learning neural networks such as convolutional neural networks (CNNs) may be used as predictive models for object recognition and image classification. A CNN may be implemented as a feed-forward artificial neural network in which individual neurons in the CNN operate in response to the image data within particular regions of the input image, and in which the receptive regions of adjacent neurons in the CNN may partially overlap. One or more CNN operations, such as three-dimensional convolution operations, may be used to approximate the responses of the individual neurons in the CNN to the data within their respective image regions. The architecture of CNNs may be formed by stacking together layers of differentiable functions to implement various CNN operations (e.g., convolution, pooling, concatenation, etc.), which may operate in sequence to transform input images into outputs such as feature maps and/or image classification scores.

Although CNNs may be effective tools for performing many advanced image processing tasks, CNNs also may be computationally demanding, requiring millions or even billions of computations in order to process a single input image. The use of CNNs also may require significant memory resources for storing the CNN network parameters and the large intermediate feature maps that are generated as the CNN processes images. Because CNNs may include many different processing layers, moving the feature maps other intermediate processing data between memories and processing systems may requiring significant memory and processing resources, greatly impacting power consumption of the system.

In order to address the significant computational and storage demands of CNNs, hardware accelerators and other specially designed hardware may be used in addition to or instead of general purpose computer processors to perform certain CNN image processing tasks. Such hardware accelerators (or hardware acceleration modules) may include computer hardware designed and implemented to perform a limited number of specific operations within computer vision or image processing systems. For instance, a hardware acceleration module may include specially designed integrated circuits, using field-programmable gate array (FPGA) technology and/or application-specific integrated circuits (ASICs), to execute a limited set of predefined operations that may be used for image processing.

In some examples, computer vision and other image processing systems may include a convolutional neural network (CNN) implemented within a hardware acceleration module which is designed to perform a predefined set of CNN operations. The CNN operations supported by a hardware acceleration module may comprise convolutions, rectified linear unit (ReLU) activations, layer concatenations, and/or the like. A CNN operating within a hardware acceleration module may be configured to apply a sequence of filters, convolutions, and/or other CNN operations in order to generate a set of feature maps based on an image data, where the different feature maps may correspond to different channels in a color channel model or other image encoding system used to encode the input image. In this example, a feature map may store a set of feature values for a specific channel, in which a feature value may correspond to a different region (e.g., set of pixel coordinates) of the input image.

For certain image processing tasks, an argument maxima (or argmax) map may be generated based on the set of channel-separated (or channel-specific) feature maps output by a CNN. In some cases, an argmax map may have the same height and width dimensions as the feature maps upon which it is based. A location within the argmax map and/or the corresponding location within the feature maps may be associated with a particular image region (e.g., set of coordinate pixel(s) or other discrete portion) of the input image. The value stored at a location in the argmax map may include a representation of the index/indices of the feature maps having the maximum feature value at that location, from among corresponding locations in the multiple channels of the feature map. Once an argmax map has been generated for an image, it may be used in various advanced image processing techniques such as image segmentation and object detection.

In some existing systems, a CNN within a hardware acceleration module may generate the sets of channel-separated feature maps for an input image, after which the feature maps may be transmitted to one or more central processing units (CPU(s)) to generate the argmax map. However, such techniques may require the large sets of feature maps output by the CNN to be read from the memory of the hardware acceleration module and transmitted to the CPU(s), which may be a time-consuming and memory-intensive process. Additionally, using a CPU to generate an argmax map may require the CPU to store and process large amounts of data from the channel-separated feature maps, calculate the argument maxima values, and then generate the argmax map. Using an external CPU to generate a "channel-wise" argmax map, that is, a map storing argmax values determined from a set of channel-separated feature maps output by a CNN in a separate hardware acceleration module, may result in costly and less efficient processing of the feature maps, high levels of consumption of the processing and memory resources of the CPU, and slower overall generation of the argmax map. These issues may affect the performance and stability of the image processing system as a whole, and may be compounded as the system processes larger amounts of image data (e.g., large and high-resolution images, higher frame rate video data).

Accordingly, certain techniques discussed herein include a computing system or architecture having a hardware acceleration module and/or a separate central processing unit (CPU), in which the hardware acceleration module uses a sequence of the predefined set of hardware accelerator operations to generate an argmax map based on feature maps. In some examples, the hardware acceleration module may be configured to receive a set of feature maps and execute a predefined sequence of hardware accelerator operations, including convolutions, rectified linear unit (ReLU) activations, and/or layer concatenation operations, to calculate maximum channel feature values and argmax values for each set of associated locations within the set of feature maps. The hardware acceleration module may generate an argmax map based at least in part on an argmax value calculated based at least in part on values indicated by a set of associated locations across the multiple channels of the feature map. In some examples, the hardware acceleration module may additionally or alternatively transmit the argmax map to the separate CPU for additional image processing tasks that may rely on the channel-wise argmax map.

In some examples, computing systems and architectures may be implemented in which the hardware acceleration module and CPU operate on different sets of hardware, and the hardware acceleration module does not use the processors or memory of the CPU when processing the feature maps output by the CNN and generating the argmax maps. In some cases, the CNN operations supported by the hardware acceleration module might not include a maximum operation and/or an argument maxima operation. Instead, predefined sequences of hardware operations supported by the hardware acceleration module may be used to calculate the maximum feature values and channel-wise argmax values, including convolution operations, rectified linear unit (ReLU) activation operations, and/or layer concatenation operations. Additionally, the hardware acceleration module may be configured to operate with fixed-point number representations, which may be used for computing the argmax values.

In various techniques described herein, a hardware acceleration module may receive a set of feature maps (e.g., from a machine-learned model) corresponding to the different channels of input images, and may use one or more predefined sequences of hardware-implemented operations discussed herein to generate an argmax maps based on the sets of feature maps. Accordingly, the computing and memory resource intensive tasks of processing feature maps and generating argmax maps may be performed within the hardware acceleration module rather than within the CPU. These techniques may therefore reduce the time to determine an argmax map, reduce CPU utilization and memory allocation and may improve the overall performance, stability, and costs of image processing systems. Additionally or alternatively, the techniques discussed herein may equip hardware acceleration modules with new functionality without changing the underlying hardware.

Example Architecture

FIG. 1 depicts a block diagram of an example image processing architecture 100, which may include a camera system 110, a hardware acceleration module 120, and/or a central processing unit (CPU) 130. As depicted in this example, the hardware acceleration module 120 may include a convolutional neural network (CNN) 121 and/or an argmax map generation component 122 (which may be referred to herein for brevity as "argmax component" 122). As discussed above, CNNs implemented within hardware acceleration modules may be used in many computationally demanding image processing tasks, including image and video recognition, segmentation, object detection, image analysis and classification, etc., which may be applicable to many different fields and technologies. In the simplified example shown in FIG. 1, image data may be captured at the camera system 110 and transmitted to the hardware acceleration module 120 for initial processing. One or more CNN(s) 121 within the hardware acceleration module 120 may be trained to process the image data by assigning importance (e.g., via weights and biases) to particular features or objects detected within the input image. Using such techniques, CNNs 121 may be able to capture spatial and/or temporal dependencies with image data through the application of filters, and may be able to reduce input images into more easily processable data while preserving the critical image features that are used for object recognition and other advanced image processing techniques.

As shown in this example, the CNN 121, or at least a component thereof, such as an activation layer, perceptron, filter, and/or the like, may output a set of feature maps based at least in part on an input image, corresponding to different channels in a color model and/or another image encoding system. For instance, a colored image received from a camera system 110 may be separated by its Red-Green-Blue (RGB) color planes. In other examples, various other color models (e.g., Grayscale, HSV, CMYK) and/or other image components may be used to separate the different image components and generate different corresponding feature maps. For example, instead of or in addition to image color channels, the input map(s) of CNN 121 also may contain values derived from image data such as Deep Feature maps (e.g., obtained by processing image data through a different CNN), feature maps obtained through classical computer vision techniques such as Histogram of Oriented Gradients (HOG) maps, or optical flow maps. The input map(s) of CNN 121 also may contain data from different sensors that may be mapped on a spatial domain, for example, depth maps. Further, the techniques described herein also may apply in the context of audio signal processing, in which case the input map(s) of CNN 121 may be raw waveforms, or a time-frequency representation of the data. In some examples, the CNN 121 also may contain recurrent neural network (RNN) elements such as long short-term memory (LSTM) units or gated recurrent units (GRUs). In the case of video processing, the input to CNN 121 may contain both video and/or audio information.

The output feature maps of a CNN, on which the channel-wise argmax operation may be computed, may be in a 1:1 correspondence to the input feature maps in some cases, or might not be in a 1:1 correspondence to the input feature maps in other cases. In some examples, the output feature maps may be class confidence maps output by an object detection model, where each location may correspond to a region in the input image, and each channel may correspond to an object class. Alternatively or additionally, the CNN 121 may output a feature map for each color plane. In the context of audio data, the output of CNN 121 may be audio event probability maps defined over a time domain.

The CNN 121 may output the set of feature maps to the argmax component 122, which may generate and output an argmax map using sequences of hardware-implemented operations configured to calculate maximum feature values and argmax values. In some examples, the argmax component 122 may be part of the CNN 121. For example, the CNN 121 may comprise a pipeline of components, one of which may comprise the argmax component 122. The argmax component 122 may transmit the argmax map out of the hardware acceleration module 120, to a separate CPU 130 for further image processing. Additionally or alternatively, although FIG. 1 depicts a CNN 121 as providing feature maps to the argmax component 122, in other examples, various other devices and/or components may provide the feature maps to the argmax component 122. For instance, the hardware acceleration module 120 may comprise a deep neural network (DNN), recurrent neural network (RNN), support vector machine (SVM), embedding layer, other machine-learned model, deep learning algorithm, and/or any other component configured to provide feature maps to the argmax component 122. Further, the CNN 121 and/or other component(s) from which the argmax component 122 receives the feature maps need not be implemented within the hardware acceleration module 120. For instance, a separate computing system external to the hardware acceleration module 120 may include CNN 121 and/or other components configured to generate and/or transmit feature maps to the argmax component 122 within the hardware acceleration module 120.

Camera system 110 may include one or more cameras or any other sensors configured to capture and output image data from the environment of the camera system 110 and/or other sensor data. For example, camera system 110 may include cameras of various types or qualities, configured with different image capture characteristics (e.g., different focal lengths, capture rates, focal points, fields of view, color capabilities). Such cameras may include common optical or light-based cameras, as well as infrared cameras, thermal imaging cameras, and night vision cameras, each of which may be configured to capture image data for be processing and analysis. Camera system 110 may additionally or alternatively include or be replaced or supplemented by a light detection and ranging (lidar) system, radio detection and ranging (radar) system, depth camera system, time of flight (TOF) system, sound navigation and ranging (sonar) system, and/or any other sensors. The camera system 110 also may be configured to perform one or more image filtering and/or preprocessing techniques. Additionally or alternatively, the hardware acceleration module 120 and/or other intermediate computer systems may be configured to perform preprocessing tasks on the image data captured by the camera system 110, before the image data is input into the CNN 121.

The hardware acceleration module 120 may refer to any combination of hardware components configured to implement a predefined set of hardware operations. As shown in FIG. 1, the hardware acceleration module 120 may include the CNN 121 and/or the argmax component 122. In other examples, the CNN 121 need not be included in the hardware acceleration module 120. In various examples, the operations of the hardware acceleration module 120 may be implemented using specially designed circuits, such as field-programmable gate array (FPGA) technology, application-specific integrated circuits (ASICs), and/or hybrids thereof, to execute limited and/or predefined sets of hardware operations (which also may be referred to as hardware-implemented operations). The hardware-implemented operations performed by the hardware acceleration module 120 may be computationally faster and more efficient than if similar operations were performed by a general-purpose computing device (e.g., CPU 130). Specific examples of the types of hardware operations supported by the hardware acceleration module 120, and the sequences of hardware operations used by the CNN 121 and the argmax component 122 are discussed below in more detail.

In some examples, the hardware acceleration module 120 may include a fixed configuration and/or predetermined number of available operations. For example, an ASIC may comprise a circuit permanently formed into silicon/other substrate and/or an FPGA may be flashed and/or otherwise configured using propriety instructions that may not be exposed to and/or modifiable by an end user.

Although examples discussed herein may refer to convolutional neural networks (e.g., CNN) for performing image processing tasks within the hardware acceleration module 120, other deep learning techniques and/or other types machine-learned models may be used in other examples. Further, although computer vision and image processing may be discussed in the context of neural networks, any type of machine-learning may be used consistent with this disclosure. For example, in addition to or instead of CNN 121, the hardware acceleration module 120 may include other types of neural networks (e.g., You Only Look Once (YOLO) neural network, VGG, DenseNet, PointNet, stacked auto-encoders, deep Boltzmann machine (DBM), deep belief networks (DBN), Hopfield network, a single perceptron), regression algorithms (e.g., ordinary least squares regression (OLSR), linear regression, logistic regression, stepwise regression, multivariate adaptive regression splines (MARS), locally estimated scatterplot smoothing (LOESS)), Bayesian algorithms (e.g., naïve Bayes, Gaussian naïve Bayes, multinomial naïve Bayes, average one-dependence estimators (AODE), Bayesian belief network (BNN), Bayesian networks), clustering algorithms (e.g., k-means, k-medians, expectation maximization (EM), hierarchical clustering), etc. In these examples, one or more of these machine-learning techniques may be applied, alternatively or in addition to using CNN(s), to compute the channel-wise argmax and/or max over a set of feature maps (e.g., probability maps for different events).

Central processing unit (CPU) 130 may receive argmax maps transmitted from the hardware acceleration module 120, and/or may perform various image processing tasks based on the received argmax maps. In some examples, CPU 130 may include general-purpose computing hardware (e.g., one or more ARM processors, one or more x86 processors) and/or network components, in contrast to the specially designed and fixed-function hardware of the hardware acceleration module 120. Accordingly, while CPU 130 may offer greater flexibility in performing a wider variety of programmed tasks, any computationally intensive tasks performed by the CPU 130 may be relatively slower and less efficient than the operations performed by the hardware acceleration module 120.

FIG. 2 depicts a block diagram of an example architecture of a hardware acceleration module, including a convolutional neural network (CNN) and a separate argmax component. The hardware acceleration module 120 shown in this example may correspond to the same module shown in FIG. 1, but this example shows additional components of the CNN 121 and the argmax component 122 that may be included in various implementations.

Within the hardware acceleration module 120, one or more CNNs 121 may be designed, trained, and implemented to generate a set of feature maps based on an input image. As noted above, for a particular input image, the CNN 121 may generate feature maps corresponding to different channels, where a feature map stores a set of feature values corresponding to different discrete portions of an image for its particular channel. In at least one example, a feature map may comprise a tensor and/or any other data structure. To process the image data and output feature maps, the CNN 121 may perform a sequence of hardware-implemented operations supported by the hardware acceleration module 120. As shown in this example, the CNN 121 may include a convolutional layer 124, a pooling layer 125, and/or a fully-connected layer 126. Examples of the operations that may be performed by layers 124-126 are described below. However, it is understood that in other examples, different types or combinations of processing layers may be used in CNN 121, including multiple iterations of convolution layers 124, pooling layers 125, and fully-connected layers 126, and that each of these layers (and/or various other hardware-implemented layers within a CNN 121) may be performed any number of times and in any sequence.

The convolutional layer 124 may be designed to carry out one or more convolution operations supported by the hardware acceleration module 120. A convolution operation may receive input images having a height (h), width (w), and a depth (n) of 1. In some cases, an input image may have a depth greater than one, such as when n related inputs are received corresponding to n different channels of the same image. The convolutional layer 124 may process each input of size (h*w*n) using a shifting kernel (or filter) to process the data in particular image regions, and output a convolved feature based on the image. Although the hardware acceleration module 120 may support convolutions with kernel sizes of one-by-one (1*1), larger kernel sizes may be used in some examples (e.g., three-by-three (3*3), five-by-five (5*5)), so that the output convolved features better capture the spatial relationships and dependencies within the image. For multiple channels (e.g., n>1), the convolutional layer 124 may use a kernel having the same depth as the number of channels, and/or may use a two-dimensional kernel on each channel-separated (or channel-specific) image.

The convolution operations performed by the convolution layer 124 may be used to extract high-level features from the input image, such as edges, colors, gradient orientations, etc. Additionally or alternatively, depending on the padding applied (if any) and stride length used for the shifting kernel, the convolved feature outputs may be same size as the input image (e.g., h*w), or may be increased or decreased in size. Additionally, while initial convolution operations may be effective for capturing low-level image features, performing sequences of multiple convolutions may also allow the CNN to identify additional high-level image features and gain an understanding of the image as a whole.

The pooling layer 125 may be configured to perform one or more pooling operations supported by the hardware acceleration module 120. Pooling operations may be used to reduce the size of convolved features output by the convolution layer 124, as well as identifying and extracting certain image features that are rotational-invariant and/or position-invariant. In various examples, max pooling and/or average pooling operations may be performed on the convolved features output by the convolution layer 124, in which the same kernel size or a different kernel size may be used. Average pooling, for example, may be used to reduce the size of the output features, while max pooling may also reduce the size as well as performing noise suppression.

In some examples, a CNN 121 may implement multiple sequential layers of a combined convolution and pooling operation. For more complex input images, more layers of convolution and pooling may be used to abstract out the complexities and better capture the relevant low-level and high-level image characteristics within the output features.

After performing the convolution and pooling operations described above, the fully-connected layer 126 may be used to identify non-linear combinations of high-level features represented within the convolutional and pooling output features, which may be used for image classification purposes. Following the convolution and pooling operations, the image data may be flattened without sacrificing the spatial/pixel dependencies and other complex image features derived by the convolution and pooling layers. Accordingly, within the fully-connected layer 126, the feature outputs may be flattened and provided as input to the feed-forward neural network of the CNN 121, which may be trained to distinguish and classify low-level features within the image.

As noted above, the output of at least one of the elements of the CNN 121 may include a set of feature maps based on the input image, where each feature map may correspond to a different channel (e.g., color channel or other component) of the image. As shown in this example, the feature maps generated by the CNN 121 may be received and processed by the argmax component 122. The argmax component 122 may trigger hardware components of the hardware acceleration module according to the sequence discussed herein to calculate maximum feature values and argmax values for each set of associated locations within the set of feature maps received from the CNN 121. In some cases, a first sequence of hardware-implemented operations 127 may be used to calculate, for each set of associated locations, the maximum of the feature values across the set of feature maps. Then, a second sequence of the hardware-implemented operations 128 may calculate the argmax value (e.g., the index value or other channel identifier) of the feature map in which the maximum value was found. Specific examples of the sequences of operations 127-128 that may be used by the argmax component 122 are described below in FIGS. 5A-5D. However, other sequences of operations may be used in other examples, including differences in the sequences of operations necessitated by different sets of operations that may be supported by different hardware acceleration modules. In some examples, the argmax component 122 may generate and transmit an argmax map, including the argmax values calculated for each set of associated locations, to the CPU 130 for further image processing.

Figure 3A:
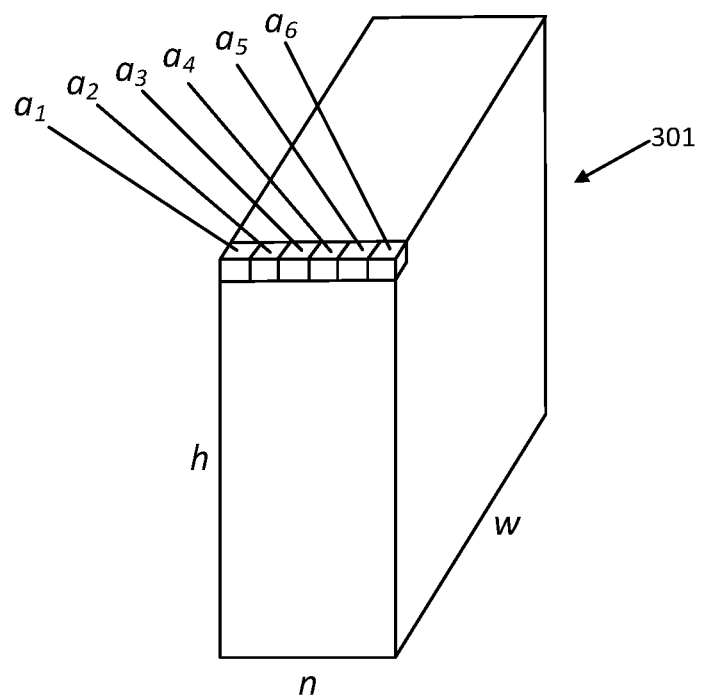
FIG. 3A shows an illustrative set of feature maps, based on an input image, including a feature map for multiple channels of the input image.
Figure 3B:
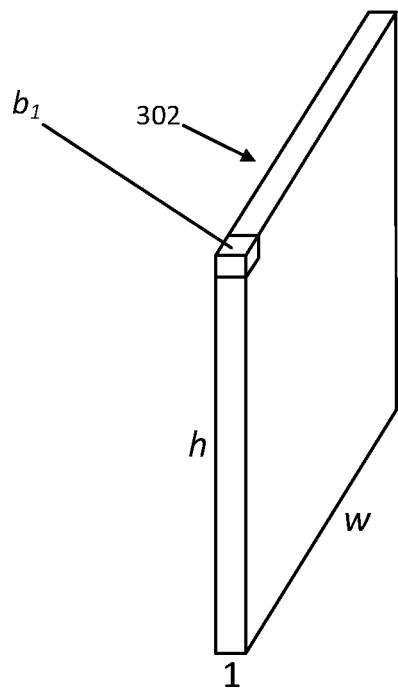
FIG. 3B shows an illustrative argmax map generated within a hardware acceleration module, based on a set of feature maps.

Referring briefly to FIGS. 3A and 3B, two examples are shown depicting an illustrative set of feature maps generated by a CNN 121 (FIG. 3A), and an argmax map that may be generated within a hardware acceleration module 120 based on the set of feature maps (FIG. 3B). In this example, FIG. 3A depicts a set of feature maps 301 as a single three-dimensional data structure, having a height (h), a width (w), and a depth (n) corresponding to the number of channels, where h, w, and n are positive integers, any two or more of which may be the same or different. In other cases, a similar set of feature maps may be depicted individually, as n separate feature maps, each feature map representing a different channel, and each feature map having a height (h), a width (w), and a depth of one (1). In this example, the number n of feature maps 301 depicted in FIG. 3A equals six (6), indicating that a set of six (6) different feature maps of size h*w have been received, corresponding to six (6) different image channels, although in additional or alternate examples the feature maps may comprise any other number of channels, e.g., 1, 2, 3, 4, 5, or more. Any different positive integer number of channels and a corresponding number (n) of feature maps may be used in other examples.

Each location within the set of feature maps 301 may store a feature value based on the output of the CNN 121. In FIG. 3A, six example feature values are shown ($a_1$ to $a_6$) corresponding to the same location within their respective feature maps (e.g., the same height and width coordinates) of six different channels. As noted above, each location within the set of feature maps (e.g., each combination of height and width values) may correspond to a region of the input image. Feature values $a_1$ to $a_6$ in FIG. 3A may represent the feature values for six different channels associated with the same region of the input image. In various examples, each particular (h, w) location within the set of feature maps 301 may correspond to a single pixel of the input image, or may be based on a larger region of the input image, depending on the image processing (e.g., convolution and/or pooling layer(s) and hyperparameters associated therewith, such as, for example, the stride, padding, dilation rate, and/or filter size) performed by the CNN 121. Similarly, the height (h) and width (w) of the feature maps 301 may be the same as the height and width of the input image in some cases, or may be larger or smaller in other cases, depending on the specific image processing performed in the CNN 121.

FIG. 3B depicts an example of an argmax map 302 that may be generated based on the set of feature maps 301. As shown in this example, the argmax map 302 may have the same height and width dimensions as the set of feature maps 301, and the depth of the argmax map 302 may be one (1). The value stored at each location in the argmax map 302 may correspond to the argument maxima (argmax) value(s) at the corresponding location in the set of feature maps 301. For instance, the argmax value stored at location $b_1$ in argmax map 302 in FIG. 3B may be the argmax value calculated based at least in part on the feature values $a_1$ to $a_6$ in FIG. 3A. As noted above, the argmax value may identify the index/indices (or other identifiers) within the set of feature maps 301, of the channel(s) having the largest feature value. For example, if the maximum of the feature values $a_1$ to $a_6$ is found at index as in the set of feature maps 301, then location $b_1$ in the argmax map may be given a value of $2^5$ (or other value associated with location as). For example, in the sequence of the hardware-implemented operations 128 used to calculate the argmax value (discussed below in FIG. 5D), the argmax values may be stored as a bitmask of all indexes, where the value of the input map is a maximum over all input maps. This example may provide potential advantages in use cases where multiple channel values may equal the maximum at a location. For instance, if the maximum feature value from $a_1$ to $a_6$ is found at $a_5$, then the location $b_1$ may be given a value with the binary representation 010000b, wherein the $n^{th}$ least significant bit indicates if the $n^{th}$ channel is equal to the maximum. In the binary representation 010000b, the fifth-least significant bit is assigned to one, and the others are assigned to zero. However, if $a_1$ and $a_5$ were both equal and maximal at the location, then $b_1$ may be given a value with the binary representation 010001b (e.g., wherein the first and fifth least significant bits are assigned to one). Other encoding techniques, such as the channel index, may be used may be used in other examples, may provide additional advantages for use cases in which it is impossible or unlikely for multiple channel values to be equal to the maximum, as discussed in more detail below. Further examples of various techniques for determining argmax values (e.g., $b_1$) based on a set of feature values (e.g., $a_1$ to $a_6$) are described below in FIGS. 5A-5D.

Example Processes

Figure 4:
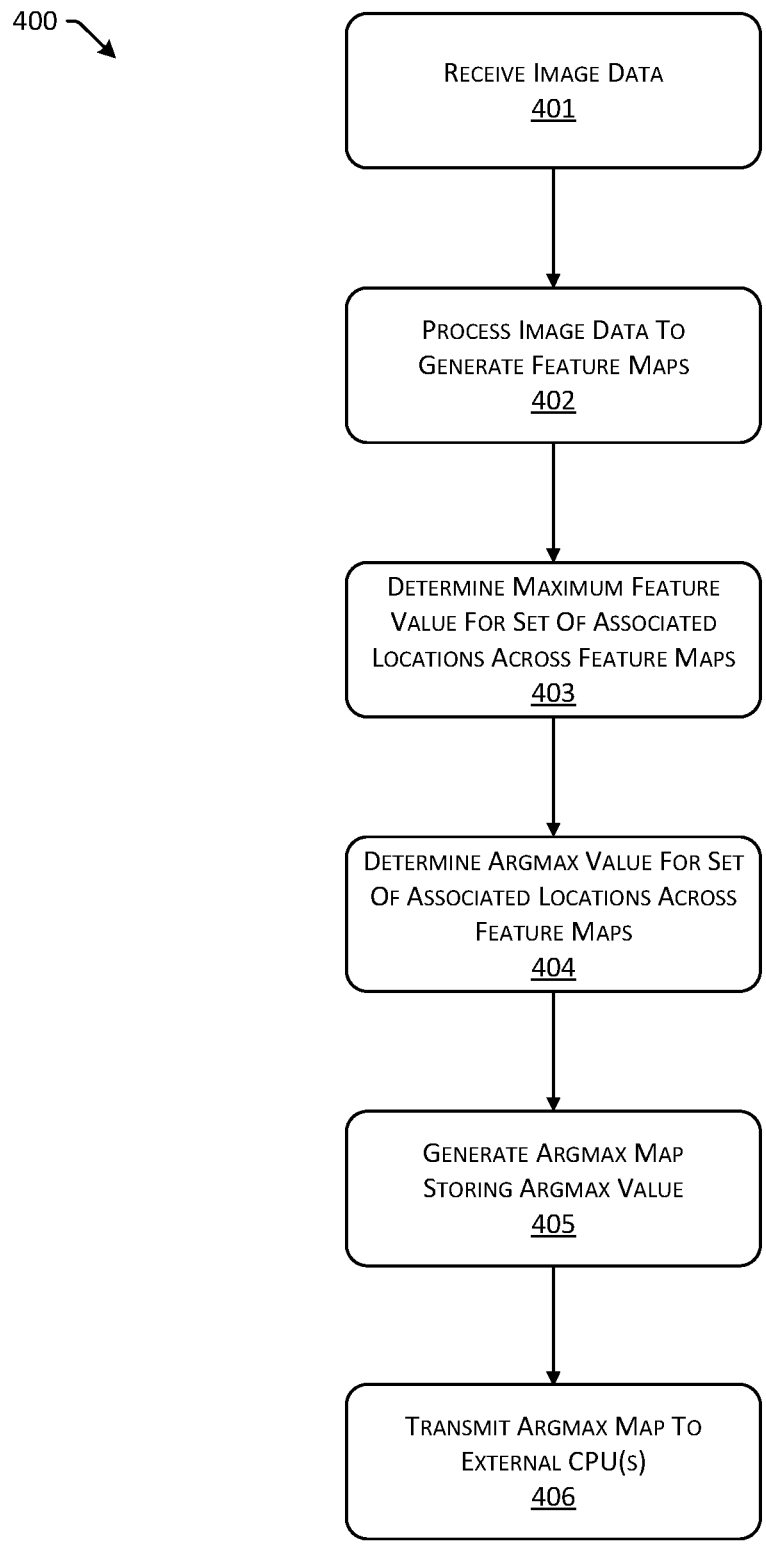
FIG. 4 illustrates a flow diagram of an example process of generating an argmax map within a hardware acceleration module.

FIG. 4 illustrates an example process of generating an argmax map within a hardware acceleration module. In some examples, example process 400 may be accomplished by one or more component(s) within the hardware acceleration module 120 discussed above, such as the CNN 121 and/or the argmax component 122. Additionally, as discussed below, example process 400 may be performed partially or entirely using the predefined hardware operations 123 supported by the hardware acceleration module 120. For example, the hardware acceleration module 120 may execute one or more of the predefined hardware operations 123 by transmitting at least a portion of data to a hardware-implemented portion of the hardware acceleration module 120 configured to determine a predetermined type of operation.

At 401, example process 400 may comprise receiving image data at the hardware acceleration module 120. In some examples, the image data may include one or more digital images and/or video frames captured by a camera system 110, including any of the image data types described herein. The image data also may be filtered and/or preprocessed in some cases, either within the hardware acceleration module 120 and/or prior to transmission to the hardware acceleration module 120. As noted above, the image data may be separated into different color planes, such as RGB or another color model, and/or may be encoded based on other image components. As discussed above, the techniques described herein also may apply to other types of data. For example, the input map(s) of CNN 121 may contain audio data, such as data received from a sound event detection technique, and the CNN 121 may output a set of probability maps for a given set of audio events over a time domain. In this example, the hardware acceleration module 120 may compute the argmax over multiple audio event probability maps, which may provide advantages in efficiently determining which audio event may be the most likely at each timestamp.

At 402, example process may comprise processing the image data within the hardware acceleration module 120 to generate a set of feature maps. The set of feature maps may be output by the CNN 121 as described above, in response to the image data input to the CNN 121. In some cases, the number of feature maps in the set may correspond to the number of different color channels into which the image has been separated. For example, if an input image is separated into six (6) different color channels, then the CNN 121 may output six different feature maps each having the same height and width dimensions. In other examples, the feature maps need not represent different color channels, but may correspond to other components within image data. Additionally, the feature maps may be based on additional or alternate types of data other than image data, such as radar/lidar sensor detection points, density map data points, data points within a statistical distribution, etc. Each feature map may include a number of locations corresponding to different regions of the input image, and at each location a feature value may be stored that corresponds to a measure of the color channel within the corresponding image region. As noted above, a feature map may be the same size in dimensions as the input image, or may be larger or smaller depending on the image preprocessing and/or depending the operations performed by the CNN 121. Additionally, it is contemplated that the feature maps generated at 402, and the subsequently generated argmax map, need not be rectangular in shape having a uniform height and width as depicted in FIGS. 3A and 3B, but may be circular, another other shape, or free form in other examples.

At 403, the example process 400 may comprise determining a maximum feature value for a set of associated locations within the set of feature maps generated by the CNN 121. As described above in FIG. 3A, the feature maps of the different channels of the feature maps may have similar or identical dimensions, and a location within a feature map (e.g., $a_1$) may be associated with a location in the other feature maps (e.g., $a_2$, $a_3$, $a_4$, $a_5$, and $a_6$). A maximum feature value determined at 403 may be a channel-wise maximum, that is, the maximum value among a set of associated locations across the set of feature maps. For instance, in FIG. 3A, the maximum feature value for the labeled set of associated locations may be the maximum value of $\{a_1, a_2, a_3, a_4, a_5, \text{and } a_6\}$. As described in more detail below, the hardware acceleration module 120 may calculate a maximum feature value using predefined sequences of hardware-implemented operations 127-128.

At 404, the example process 400 may comprise determining an argmax value for a set of associated locations within the set of feature maps. As discussed above, a maximum feature value determined at 403 may be the maximum value of a set of associated locations across the set of feature maps. In contrast, the argmax value (or argument maxima value) determined at 404 may identify where the maximum value(s) is/are stored. In some examples, the argmax value may be a bitmask of the indexes identifying which feature maps store the maximum value for the set of associated locations. For instance, referring again to FIG. 3A, if the maximum value out of the set of associated locations $\{a_1, a_2, a_3, a_4, a_5, \text{and } a_6\}$ is stored at location $a_4$, then the argmax value for this set of locations may be a value indicating location $a_4$ (e.g., a bitmask with the fourth least significant bit set to 1). In other examples, the argmax value may otherwise identify the particular feature map(s) and/or the particular channel(s) at which the maximum value was found.

At 405, the example process 400 may comprising generating an argmax map storing the argmax value determined at 404. The argmax map may have a same or similar set of dimensions and/or the identical number of storage locations, as at least one of the feature maps generated at 402. The location of the argmax map may store an argmax values determined at 404 for the corresponding set of associated locations within the set of feature maps. For instance, referring to FIGS. 3A and 3B, location $b_1$ in FIG. 3B may store the argmax value determined for the set of associated locations $a_1$ to $a_6$ in FIG. 3A.

At 406, the example process 400 may comprise transmitting the argmax map from the hardware acceleration module 120 to CPU 130 for additional image processing. As noted above, argmax maps based on image data may be used by CPU 130 in various image processing techniques in different technologies and fields, including feature recognition, image segmentation, image restoration and reconstruction, etc. The techniques described herein may be implemented within computer vision and/or image processing systems, as well as systems within other technical fields in which a hardware-implemented argmax layer is implemented. In certain conventional hardware accelerators, an argmax function might not be implemented within the set of predefined functions within the hardware accelerator. Accordingly, the techniques described herein may save computing and memory resources of the CPU 130, by using an improved hardware acceleration module 120 capable of generating argmax maps, resulting in faster and more efficient generation of argmax maps as well as improved overall stability and performance of the system.

Figure 5A:
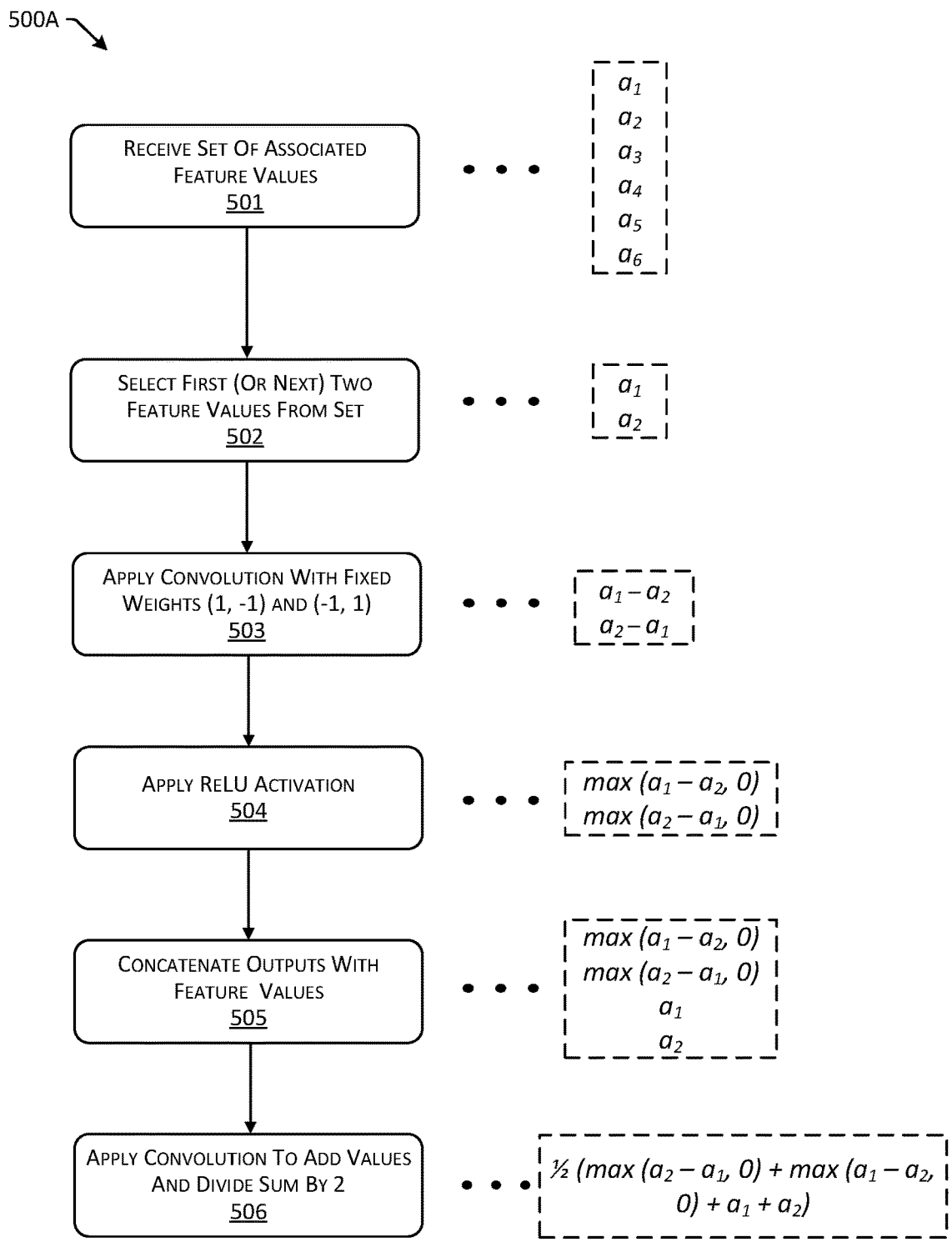
FIGS. 5A-5D illustrate flow diagrams of an example process for generating an argmax map within using a predefined set of hardware operations of a hardware acceleration module.
Figure 5B:
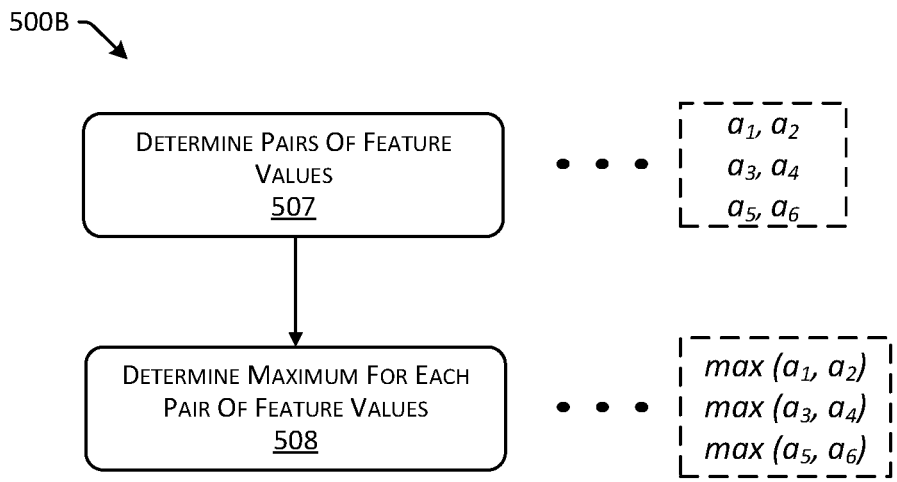
Figure 5C:
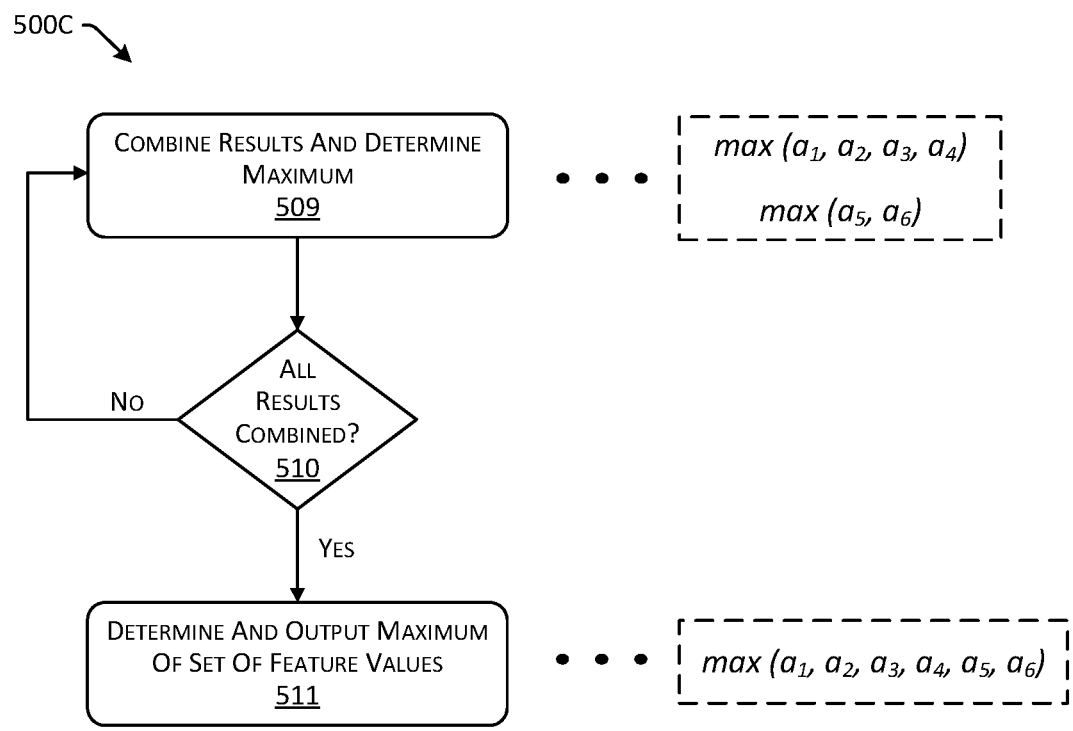
Figure 5D:
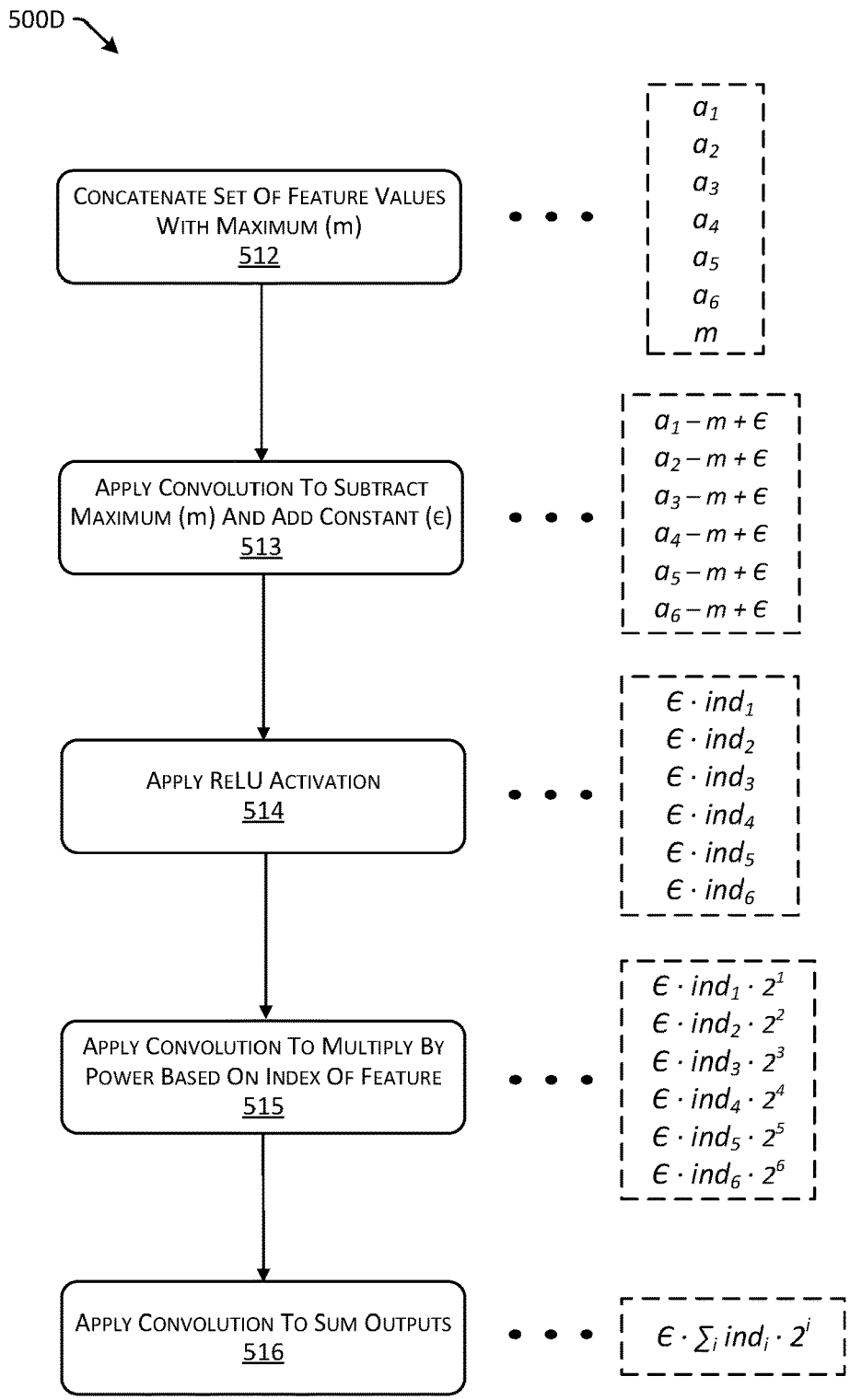

FIGS. 5A-5D are flow diagrams illustrating example processes in which one or more sequences of CNN operations may be executed to generate an argmax map within a hardware acceleration module. In some examples, processes 500A-500D may be accomplished by one or more component(s) within the hardware acceleration module 120 discussed above, such as the argmax component 122, using a fixed-function set of predefined hardware operations 123 implemented within the hardware acceleration module 120. Process 500A shown in FIG. 5A illustrates a sequence of hardware-implemented operations that may be executed by the argmax component 122 to determine a maximum feature value out of two feature values from a set of associated feature values. Processes 500B and 500C, shown in FIGS. 5B and 5C, illustrate related sequences of hardware-implemented operations that, using multiple iterations of the sequence of operations in process 500A, determine maximum feature values for sets of associated feature values. For example, operation 403 may comprise processes 500A, 500B, and 500C. Process 500D shown in FIG. 5D illustrates another sequence of hardware-implemented operations that may determine an argmax value for a set of associated feature values. For example, operation(s) 404 may comprise process 500D.

FIGS. 5A-5D are discussed below as separate processes 500A-500D, and these processes may be implemented separately, independently, and/or in parallel, using separate sequences of hardware operations that may be stored and executed by different modules or components within the hardware acceleration module 120. In other examples, at least two of processes 500A, 500B, 500C, and/or 500D may be combined and implemented as a single sequence of hardware operations that may be executed by an argmax component 122 to generate a channel-wise argmax map based on a set of feature maps output by the CNN 121. The combination of processes 500A-500D may describe the sequence(s) of predefined hardware operations 123 that may be used in one or more implementations of process 400. However, it is to be understood that processes 500A-500D are illustrative and not limiting, and that in other examples other sequences of the predefined hardware operations 123 implemented by a hardware acceleration module 120 may be used to generate a channel-wise argmax map based on a set of feature maps.

In FIG. 5A, process 500A describes a sequence of hardware operations that may be used to determine a maximum out of a pair of feature values from taken from a set of associated feature values. As described below, processes 500A and 500B may be used in combination to determine a maximum feature value for a set of associated locations within a set of feature maps generated by the CNN 121, corresponding to the above discussion of block 403 in FIG. 4.

At 501, example process 500A may comprise the argmax component 122 receiving a set of associated feature values. As discussed above, the associated feature values may be the feature values stored at a set of associated (or corresponding) locations across the set of feature maps. For instance, referring to the example set of feature maps shown in FIG. 3A, feature values $a_1$, $a_2$, $a_3$, $a_4$, $a_5$, and $a_6$ may be a set of feature values associated with a same location across multiple (6, in the illustrated example) different channels, in that each is stored at the same corresponding location in a different feature map.

At 502, the argmax component 122 may select the first two feature values from the set of associated feature values. In this example, the feature values $a_1$ and $a_2$ may be selected. As discussed below, process 500A may be executed iteratively, in which different pairs of the feature values may be selected in different iterations. For instance, $a_1$ and $a_2$ may be selected in a first iteration, feature values $a_3$ and $a_4$ may be selected in the second iteration, and so on.

At 503, the argmax component 122 may apply a convolution operation the feature values selected at 502, with kernel size 1*1 and with fixed weights defined by the matrix $$\begin{bmatrix} 1 & -1 \\ -1 & 1 \end{bmatrix}.$$

As noted above, the hardware acceleration module 120 may implement a set of predefined hardware operations 123, including convolutions having various kernel sizes (e.g., 1*1, 1*2, 3*3). Based on the fixed weights of $$\begin{bmatrix} 1 & -1 \\ -1 & 1 \end{bmatrix},$$

the output from the convolution at 503 may comprise $$\begin{bmatrix} a_1 - a_2 \\ a_2 - a_1 \end{bmatrix}.$$

At 504, the argmax component 122 may apply a rectified linear unit (ReLU) activation function to the output of the convolution at 503. A ReLU activation is a mathematic activation function defined generally as y=max (0, x). In this example, the output of the ReLU activation applied at 504 may comprise $$\begin{bmatrix} \max(a_1 - a_2, 0) \\ \max(a_2 - a_1, 0) \end{bmatrix}.$$

Although this example describes using a ReLU activation function, in other examples, variants of the ReLU activation function may be used at 504 and/or in place of any other ReLU activation functions described herein. For example, a Parametric Rectified Linear Unit (PReLU) and/or Leaky ReLU may be used in some examples. ReLU is a particular case of the Parametric Rectified Linear Unit (PReLU) activation function, where the PReLU parameter comprising the negative slope may be set to zero. In the case of Leaky ReLU, the formulas for the outputs of step 504 and 505 may change but may be performed similarly, with the output of step 506 being max values ($a_1$, $a_2$), if the constant parameters used for the convolution at step 506 are adjusted. Other activation functions, including ReLU approximations or translations, such as softplus, Swish, or ELU also may be used in some examples, for instance, if the hardware acceleration module 120 supports these functions in addition to or instead of supporting ReLU.

At 505, the argmax component 122 may concatenate the output of the ReLU activation at 504 with the two feature values selected at 502. Continuing the previous example, the output of the concatenation performed at 505 may be the set of four values:

$$\begin{bmatrix} \max(a_1 - a_2, 0) \\ \max(a_2 - a_1, 0) \\ a_1 \\ a_2 \end{bmatrix}$$

At 506, the argmax component 122 may apply another convolution operation to the output of the concatenation at 505, in which the four values in the output at 505 are summed and then divided by 2. Continuing the previous example, the output of the convolution operation at 506 may correspond to the following equation:

$$½(\max(a_1-a_2,0)+\max(a_2-a_1,0)+a_1+a_2) \tag{1}$$

The argmax component 122 may apply this equation to determine the maximum of $a_1$ and $a_2$, using the hardware operations described above. To further illustrate, if $a_1$ is greater than $a_2$, then max($a_1-a_2$, 0) will be $a_1-a_2$, and max($a_2-a_1$, 0) will be 0. Otherwise, if $a_2$ is greater than $a_1$, then max($a_1-a_2$, 0) will be 0, and max($a_2-a_1$, 0) will be $a_2-a_1$. In this example, if $a_1$ is greater than $a_2$, then (max ($a_1-a_2$, 0)+max($a_2-a_1$, 0)+$a_1$+$a_2$) is equal to $2a_1+a_2-a_2$, which is equal to $2a_1$. Similarly, if $a_2$ is greater than $a_1$, then (max($a_1-a_2$, 0)+max($a_2-a_1$, 0)+$a_1$+$a_2$)) is equal to $2a_2+a_1-a_1$, which is equal to $2a_2$. The above equation may be equivalent to max ($a_1$, $a_2$).

The convolution applied at 506 may provide the maximum of $a_1$ and $a_2$, using the predefined hardware operations 123 implemented by and performed within the hardware acceleration module 120, including examples in which a maximum operation (or max operation) is not implemented within the hardware acceleration module 120.

In FIGS. 5B and 5C, processes 500B and 500C are illustrated, in which the process 500A (and/or similar processes) may be executed multiple times to determine a maximum feature value for a set of associated feature values. Processes 500A-500C may be integrated and performed in conjunction with one another by the argmax component 122. In some examples, process 500C may be implemented as a first set of hardware-implemented operations which invokes a second set of hardware-implemented operations to perform process 500B one or more times, which invokes a third set of hardware-implemented operations to perform process 500A one or more times.

Within process 500B, at 507 the argmax component 122 may determine pairs of feature values from a set of feature values corresponding to an associated set of locations across the feature maps. For instance, referring to the example set of feature maps shown in FIG. 3A having the set of associated feature values ($a_1$, $a_2$, $a_3$, $a_4$, $a_5$, and $a_6$), at 507 the argmax component 122 may divide the feature values into pairs of ($a_1$, $a_2$), ($a_3$, $a_4$), and ($a_5$, $a_6$).

At 508, the argmax component 122 may determine the maximum value of a pair of feature values. In some examples, operation 508 may comprise process 500A. Operation 508 may include, for example, initiating and/or otherwise triggering process 500A for a pair of feature values to determine the maximum of the pair. Continuing the above example, a process 500A may be performed on each pair ($a_1$, $a_2$), ($a_3$, $a_4$), and ($a_5$, $a_6$) to calculate the outputs of max($a_1$, $a_2$), max($a_3$, $a_4$), and max($a_5$, $a_6$).

As shown in FIG. 5B, the argmax component 122 may perform process 500B multiple times, and each execution of process 500B may invoke process 500A for a pair of adjacent channels. The argmax component 122 may perform process 500B for multiple pairs of channels, in parallel or independently. For example, each execution of process 500B may take as input n channels and may output $\lceil n/2 \rceil$ channels, where $\lceil \cdot \rceil$ is the ceiling function, and where each output channel is a maximum of two adjacent input channels or an input channel. In some examples, process 500B may be implemented as a modified variant of process 500A, that performs each of 503-506 on multiple groups of channels as a single hardware instruction for each step. For instance, in 508 of process 500B, the argmax component 122 may perform a convolution with pre-defined weights (e.g., applied as a single hardware operation, corresponding to step 503) may take as input channels $a_1$, $a_2$, ... $a_n$, and may output channels $a_1-a_2$, $a_2-a_1$, $a_3-a_4$, $a_4-a_3$, ..., $a_{n-1}-a_n$, $a_n-a_{n-1}$, then may apply a ReLU (e.g., as a single hardware operation, corresponding to step 504) to all channels described above, yielding the following output channels: max ($a_1-a_2$, 0), max ($a_2-a_1$, 0), ..., max($a_{n-1}-a_n$, 0), max($a_n-a_{n-1}$, 0), then may concatenate the channels output with all input channels (e.g., as a single hardware operation, corresponding to step 505), and then may perform a convolution with pre-defined weights (e.g., as a single hardware operation, corresponding to step 505), yielding the channels ½*(max($a_1-a_2$, 0)+max($a_2-a_1$, 0)+$a_1$+$a_2$), ..., ½*(max($a_{n-1}-a_n$, 0)+max($a_n-a_{n-1}$, 0)+$a_{n-1}$+$a_n$).

The multiple executions of process 500A at 508 in process 500B may be performed in parallel, and each execution may be independent of the others. Additionally or alternatively, each process 500A may be performed as a fixed number of convolutions, ReLU activations, and/or concatenation layers applied to distinct pairs of feature values (e.g., for different pairs of channels), and additional executions of process 500A may be performed without a significant performance impact on the hardware acceleration module 120.

In FIG. 5C, process 500C may include a repeated invocation of process 500B, described above, until the number of channels is reduced to one. At 509-510, the argmax component 122 may perform an iterative loop, in which the results from the previous executions of process 500B may be combined and used as inputs to new executions of process 500B. For example, continuing the example above, the output of max($a_1$, $a_2$) and max($a_3$, $a_4$) determined in one execution of process 500B may be used as input to another execution of process 500B to determine max($a_1$, $a_2$, $a_3$, $a_4$). Then, in the next iteration another process 500B may be executed with inputs of max($a_1$, $a_2$, $a_3$, $a_4$) and max($a_5$, $a_6$). The number of iterations performed of process 500B may depend on the number of feature values in the set of associated feature values (which also may be the number of feature maps), and rounds or iterations having multiple processes 500B may be performed in parallel.

At 511, after iteratively executing process 500B and combining until all the results have been combined (510: Yes), the output of the final execution of process 500B may calculate the maximum feature value of the set of feature values stored in the associated locations. Continuing with the example above, the final output of the final execution of process 500B, determining at 511 may correspond to max ($a_1$, $a_2$, $a_3$, $a_4$, $a_5$, $a_6$), which is the maximum feature value for the set of associated locations $a_1$ to $a_6$. Process 500C, including one or more executions of process 500B, may be performed for each separate set of associated locations within the feature maps received from the CNN 121.

In FIG. 5D, an additional or alternative process 500D is illustrated in which the argmax component 122 may execute another sequence of hardware operations 128 to determine an argument maxima (argmax) value for the set of associated locations. Process 500D may use the maximum feature value determined by process 500C for a set of associated locations, and may execute a predetermined sequence of hardware operations to calculate the argmax value corresponding to the maximum feature value. Process 500D may correspond to one possible implementation of the argmax value determination discussed above at block 404 of FIG. 4. The argmax value may identify the channel of the maximum feature value and/or the feature map associated with the maximum feature value for the set of associated locations, and may be output and store an index value or other channel/feature map identifier.

At 512, the maximum feature value (m) determined at 511 for the set of associated locations may be concatenated with the full set of associated feature values. Continuing the above example, the maximum value of all channels (m) determined above may be concatenated with the initial listing of channels $a_1$ to $a_6$, resulting in an output set of {$a_1$, $a_2$, $a_3$, $a_4$, $a_5$, $a_6$, m}. To perform the concatenation at 512, the argmax component 122 may use a hardware-implemented concatenation operation within the hardware acceleration module 120.

At 513, the argmax component 122 may apply another convolution to subtract the maximum feature value (m), and add a constant value $\epsilon$ to each of the set of associated feature values in the output of 512. For example, for each of $a_1$ to $a_6$, the value m may be subtracted, and a constant $\epsilon$ may be added, resulting in an output set of:

$$\begin{bmatrix} a_1 - m + \epsilon \\ a_2 - m + \epsilon \\ a_3 - m + \epsilon \\ a_4 - m + \epsilon \\ a_5 - m + \epsilon \\ a_6 - m + \epsilon \end{bmatrix}$$

In some cases, it may be advantageous to define the constant value ($\epsilon$) as a small positive number. For instance, $\epsilon$ may be defined as the smallest positive number that can be represented within the channel representation of the hardware acceleration module 120. For instance, in the hardware acceleration module 120, if the channel values are 8-bit numbers, which are represented in a fixed-point format with 6 integer bits, including a sign bit, and 2 fractional bits, then $\epsilon$ may be 00000001b in binary, corresponding to the value 0.25. By defining the constant value ($\epsilon$) as a small positive number, this may cause the output set generated at 513 to consist of all negative numbers, except where $a_n$ is the maximum feature value in which case the output would be $\epsilon$.

At 514, the argmax component 122 may apply a rectified linear unit (ReLU) to the output of the convolution at 513. The ReLU activation is defined as y=max (0, x), and may cause all negative numbers within the output set of 513 to be set to zero. In this example, the variable $ind_i$ may correspond to a maximum indicator for each channel index i, which may be set to one if $a_i$ is equal to the maximum feature value within the set of associated feature values, and may be set to zero if $a_i$ is not equal to the maximum feature value. The ReLU activation at 514 may output a result set of:

$$\begin{bmatrix} \epsilon \cdot ind_1 \\ \epsilon \cdot ind_2 \\ \epsilon \cdot ind_3 \\ \epsilon \cdot ind_4 \\ \epsilon \cdot ind_5 \\ \epsilon \cdot ind_6 \end{bmatrix}$$

Because $ind_i$ may be either zero or one, depending on whether $a_i$ is equal to the maximum feature value, then each output in the result set may be zero, except where $a_n$ is the maximum feature value in which case the output would be set at $\epsilon$.

At 515, the argmax component 122 may apply another convolution to the output set of 514, by which each member (i) of the output set is multiplied by $2^{i-1}$. Continuing with the above example, the convolution at 515 may output the set:

$$\begin{bmatrix} \epsilon \cdot ind_1 \cdot 2^0 \\ \epsilon \cdot ind_2 \cdot 2^1 \\ \epsilon \cdot ind_3 \cdot 2^2 \\ \epsilon \cdot ind_4 \cdot 2^3 \\ \epsilon \cdot ind_5 \cdot 2^4 \\ \epsilon \cdot ind_6 \cdot 2^5 \end{bmatrix}$$

At 516, a final convolution may be performed to sum the output set of 515. Continuing with the previous example, the output of the convolution operation at 516 may correspond to the following equation:

$$\epsilon \cdot \Sigma_i ind_i \cdot 2^{i-1} \quad (2)$$

This equation may be equal to the sum of the output set of 515. The operations performed in process 500D may be combined to perform a bitmask of the indexes of the channel, in which the index value of the feature map having the maximum feature value $a_i$ is set to one, and all other index values feature maps not having the feature map are set to zero. As noted above, $\epsilon$ may be defined as a small positive value (e.g., 0.25, which is 00000001b in values encoding), the output of 516 may be a bitmask with the i-th least significant bit equal to one, if the i-th channel (e.g., the feature value within the i-th feature map) is equal to the maximum feature value across all channels. It should also be noted that multiple channels may equal the maximum, and so there may be more than one maximum feature value in the set of associated locations. Additionally, although 515 and 516 may be performed as separate operations (e.g., separate convolutions) as described in this example, in other examples 515 and 516 may be combined and performed as a single convolution. For instance, the output set of 514 may be multiplied by $2^{(i-1)}$, and all values may be summed to produce the output argmax map.

As noted above, an argmax value may be represented as a bit set, where for each maximum feature value the corresponding significant bit is assigned to one, and all other bits are assigned to zero. In other examples, the argmax component 122 may use other encoding techniques to represent argmax values. For instance, a channel index technique may be used in examples when it is impossible or very unlikely that multiple channel values may be equal to the maximum. To implement a channel index encoding, at step 515 the argmax component 122 may multiply the channels by the factors 1, 2, . . . n. In this case, if one channel has a maximum value, the output may be the index of the channel with the maximal value. However, if multiple channels have the maximum value, the output may be undefined. The channel index encoding in this example may have potential advantages in use cases when it is impossible or very unlikely that multiple channel values are equal to the maximum, such as requiring a lower minimum number of bits for the output channel (e.g., at least log 2(n)).

Each output of process 500D for a set of associated locations, may correspond to the output channel of the image that has the maximum feature value at the location. Continuing with the above example, location $b_1$ in FIG. 3B may store a bitmask value representing the output channels having the maximum feature value across the channels/feature maps at the set of associated locations ($a_1$ to $a_6$).

As noted above, the number of feature maps output by the CNN 121 and received at the argmax component 122 may be based at least in part on the number of channels (n). The output from process 500D, which may store the bitmask of the output channel, may comprise at least n-bits in size in order to hold the output channel, although the output channel may comprise more or less dimensions such as in examples where the argmax comprises upsampling (e.g., determining an argmax for a portion of a feature map that is smaller than a region sampled by a filter of a convolutional layer) and/or downsampling (e.g., determining an argmax for a portion of a feature map that is larger than a filter size of a convolutional layer and/or comprises more than one discrete portion of the feature map). For examples in which the number of channels and feature maps (n) is greater than the bit size of the output channel, then the argmax component 122 may use multiple output channels for the argmax output 516, which may be output in the format of a bitmask, vector, or tensor, etc.

Example Clauses

A. A system comprising: a central processing unit (CPU), comprising: one or more processors; and a memory storing processor-executable instructions that, when executed by the one or more processors, cause the system to perform software operations; and a hardware acceleration module, comprising a plurality of integrated circuits configured to perform one or more hardware-implemented operations, wherein the hardware acceleration module is configured to: receive a plurality of feature maps based on image data, each feature map having a first location storing a first feature value based on one or more regions of the image data, wherein each feature map stores one or more feature values for a different channel of the image data, and wherein a first set of associated feature values includes the first feature value stored at the first location within each of the plurality of feature maps; determine an argument maxima value for the first set of associated feature values, wherein the argument maxima value is determined by executing a sequence of the hardware-implemented operations on the first set of associated feature values; generate an argument maxima map storing the argument maxima value determined for the first set of associated feature values; and transmit the argument maxima map to the CPU for processing via the software operations.

B. The system of paragraph A, wherein the CPU and hardware acceleration module comprise different sets of hardware.

C. The system of either paragraph A or B, wherein the hardware-implemented operations implemented by the hardware acceleration module include at least a convolution operation, a rectified linear unit (ReLU) activation operation, and a layer concatenation operation, and wherein the hardware acceleration module.

D. The system of any one of paragraphs A-C, wherein the hardware acceleration module is configured to operate with fixed-point number representations.

E. A hardware acceleration module, comprising: a plurality of integrated circuits configured to perform one or more hardware-implemented operations, wherein the hardware acceleration module is configured to: receive a plurality of feature maps based on image data, each feature map having a first location storing a first feature value based on one or more regions of the image data, wherein each feature map stores one or more feature values for a different channel of the image data, and wherein a first set of associated feature values includes the first feature value stored at the first location within each of the plurality of feature maps; determine an argument maxima value for the first set of associated feature values, wherein the argument maxima value is determined by executing a sequence of the hardware-implemented operations on the first set of associated feature values; and generate an argument maxima map storing the argument maxima value determined for the first set of associated feature values.

F. The hardware acceleration module of paragraph E, wherein the hardware-implemented operations implemented by the hardware acceleration module include at least a convolution operation, a rectified linear unit (ReLU) activation operation, and a layer concatenation operation.

G. The hardware acceleration module of paragraph E or F, wherein the hardware acceleration module is configured to operate with fixed-point number representations.

H. The hardware acceleration module of any one of paragraphs E-G, wherein the hardware acceleration module is further configured to transmit the argument maxima map to a central processing unit (CPU) comprising a separate set of hardware from the hardware acceleration module.

I. The hardware acceleration module of any one of paragraphs E-H, wherein determining the argument maxima value for a first set of associated feature values stored at the first location within each of the plurality of feature maps comprises: using a first sequence of the hardware-implemented operations implemented by the hardware acceleration module, to determine a maximum of the first set of associated feature values; and using a second sequence of the hardware-implemented operations implemented by the hardware acceleration module, to determine a first argument maxima value corresponding to the determined maximum of the first set of associated feature values.

J. The hardware acceleration module of one of paragraphs E-I, wherein the first sequence of hardware-implemented operations used to determine the maximum of the first set of associated feature values comprises: performing a first hardware-implemented convolution operation, with fixed weights, on two feature values within the first set of associated feature values, to generate a first set of outputs; applying a hardware-implemented ReLU activation operation to the first set of outputs, to generate a second set of outputs; performing a hardware-implemented concatenation operation on the second set of outputs and the two feature values, to generate a third set of outputs; and performing a second hardware-implemented convolution operation to sum the third set of outputs and divide the sum by two.

K. The hardware acceleration module of one of paragraphs E-J, wherein determining the maximum of the first set of associated feature values comprises performing the first sequence of hardware-implemented operations a number of times depending on the number of feature values within the first set of associated feature values.

L. The hardware acceleration module of one of paragraphs E-K, wherein the second sequence of operations used to determine the first argument maxima value corresponding to the determined maximum of the first set of associated feature values comprises: performing a hardware-implemented concatenation operation on the first set of feature values and the determined maximum of the first set of feature values, to generate a fourth set of outputs; performing a third hardware-implemented convolution operation to subtract the determined maximum of the first set of associated feature values from, and add a positive constant value, each of first set of associated feature values, to generate a fifth set of outputs; applying a hardware-implemented ReLU activation operation to the fifth set of outputs, to generate a sixth set of outputs; and performing at least a fourth hardware-implemented convolution operation on the sixth set of outputs, in which each particular output of the sixth set of outputs is multiplied by two to the power of an index value associated with the particular output, to generate a seventh set of outputs, and in which the seventh set of outputs is summed to calculate the first argument maxima value.

M. A method comprising: receiving, at a hardware acceleration module, a plurality of feature maps based on image data, each feature map having a first location storing a first feature value based on one or more regions of the image data, wherein each feature map stores one or more feature values for a different channel of the image data, and wherein a first set of associated feature values includes the first feature value stored at the first location within each of the plurality of feature maps; determining, by the hardware acceleration module, an argument maxima value for the first set of associated feature values, wherein the argument maxima value is determined by executing a sequence of hardware-implemented operations on the first set of associated feature values; and generating, by the hardware acceleration module, an argument maxima map storing the argument maxima value determined for the first set of associated feature values.

N. The method of paragraph M, wherein the hardware-implemented operations implemented by the hardware acceleration module include at least a convolution operation, a rectified linear unit (ReLU) activation operation, and a layer concatenation operation.

O. The method of paragraph M or N, wherein the hardware acceleration module is configured to operate with fixed-point number representations.

P. The method of one of paragraphs M-O, further comprising transmitting the argument maxima map to a central processing unit (CPU) comprising a separate set of hardware from the hardware acceleration module.

Q. The method of any one of paragraphs M-P, wherein determining the argument maxima value for a first set of associated feature values stored at the first location within each of the plurality of feature maps comprises: using a first sequence of the hardware-implemented operations implemented by the hardware acceleration module, to determine a maximum of the first set of associated feature values; and using a second sequence of the hardware-implemented operations implemented by the hardware acceleration module, to determine a first argument maxima value corresponding to the determined maximum of the first set of associated feature values.

R. The method of paragraph any one of paragraphs M-Q, wherein the first sequence of hardware-implemented operations used to determine the maximum of the first set of associated feature values comprises: performing a first hardware-implemented convolution operation, with fixed weights, on two feature values within the first set of associated feature values, to generate a first set of outputs; applying a hardware-implemented ReLU activation operation to the first set of outputs, to generate a second set of outputs; performing a hardware-implemented concatenation operation on the second set of outputs and the two feature values, to generate a third set of outputs; and performing a second hardware-implemented convolution operation to sum the third set of outputs and divide the sum by two.

S. The method of any one of paragraphs M-R, wherein determining the maximum of the first set of associated feature values comprises performing the first sequence of hardware-implemented operations a number of times depending on the number of feature values within the first set of associated feature values.

T. The method of any one of paragraphs M-S, wherein the second sequence of operations used to determine the first argument maxima value corresponding to the determined maximum of the first set of associated feature values comprises: performing a hardware-implemented concatenation operation on the first set of feature values and the determined maximum of the first set of feature values, to generate a fourth set of outputs; performing a third hardware-implemented convolution operation to subtract the determined maximum of the first set of associated feature values from, and add a positive constant value, each of first set of associated feature values, to generate a fifth set of outputs; applying a hardware-implemented ReLU activation operation to the fifth set of outputs, to generate a sixth set of outputs; and performing at least a fourth hardware-implemented convolution operation on the sixth set of outputs, in which each particular output of the sixth set of outputs is multiplied by two to the power of an index value associated with the particular output, to generate a seventh set of outputs, and in which the seventh set of outputs is summed to calculate the first argument maxima value.

U. A hardware acceleration module that performs the operations recited by any one of paragraphs M-T.

V. A non-transitory computer-readable medium storing processor-executable instructions that, when executed by one or more processors, cause the one or more processors to perform operations recited by any one of paragraphs M-T.

W. A system comprising: a central processing unit (CPU) and a hardware acceleration module that performs the operations recited by any one of paragraphs M-T.

X. A system comprising: one or more processors; and a memory storing processor-executable instructions that, when executed by the one or more processors, cause the system to perform operations recited by any one of paragraphs M-T.

Although the subject matter has been described in language specific to structural features and/or methodological acts, it is to be understood that the subject matter defined in the appended claims is not necessarily limited to the specific features or acts described. Rather, the specific features and acts are disclosed as example forms of implementing the claims.

The components described herein represent instructions that may be stored in any type of computer-readable medium and may be implemented in software and/or hardware. All of the methods and processes described above may be embodied in, and fully automated via, software code components and/or computer-executable instructions executed by one or more computers or processors, hardware, or some combination thereof. Some or all of the methods may alternatively be embodied in specialized computer hardware.

Conditional language such as, among others, "may," "could," "may" or "might," unless specifically stated otherwise, are understood within the context to present that certain examples include, while other examples do not include, certain features, elements and/or steps. Thus, such conditional language is not generally intended to imply that certain features, elements and/or steps are in any way required for one or more examples or that one or more examples necessarily include logic for deciding, with or without user input or prompting, whether certain features, elements and/or steps are included or are to be performed in any particular example.

Conjunctive language such as the phrase "at least one of X, Y or Z," unless specifically stated otherwise, is to be understood to present that an item, term, etc. may be either X, Y, or Z, or any combination thereof, including multiples of each element. Unless explicitly described as singular, "a" means singular and plural.

Any routine descriptions, elements or blocks in the flow diagrams described herein and/or depicted in the attached figures should be understood as potentially representing modules, segments, or portions of code that include one or more computer-executable instructions for implementing specific logical functions or elements in the routine. Alternate implementations are included within the scope of the examples described herein in which elements or functions may be deleted, or executed out of order from that shown or discussed, including substantially synchronously, in reverse order, with additional operations, or omitting operations, depending on the functionality involved as would be understood by those skilled in the art.

Many variations and modifications may be made to the above-described examples, the elements of which are to be understood as being among other acceptable examples. All such modifications and variations are intended to be included herein within the scope of this disclosure and protected by the following claims.

What is claimed is:

1. A system comprising:
a central processing unit (CPU), comprising:
one or more processors; and
a memory storing processor-executable instructions that, when executed by the one or more processors, cause the system to perform software operations; and
a hardware acceleration module, comprising a plurality of integrated circuits configured to perform one or more hardware-implemented operations, wherein the hardware acceleration module is configured to:
receive a plurality of feature maps based on image data, each feature map having a first location storing a first feature value based on one or more regions of the image data, wherein each feature map stores one or more feature values for a different channel of the image data, and wherein a first set of associated feature values includes the first feature value stored at the first location within each of the plurality of feature maps;
determine an argument maxima value for the first set of associated feature values, wherein the argument maxima value is determined by executing a sequence of the hardware-implemented operations on the first set of associated feature values;
generate an argument maxima map storing the argument maxima value determined for the first set of associated feature values; and
transmit the argument maxima map to the CPU for processing via the software operations.

2. The system of claim 1, wherein the CPU and hardware acceleration module comprise different sets of hardware.

3. The system of claim 1, wherein the hardware-implemented operations implemented by the hardware acceleration module include at least a convolution operation, a rectified linear unit (ReLU) activation operation, and a layer concatenation operation, and wherein the hardware acceleration module.

4. The system of claim 3, wherein the hardware acceleration module is configured to operate with fixed-point number representations.

5. A hardware acceleration module, comprising:
a plurality of integrated circuits configured to perform one or more hardware-implemented operations, wherein the hardware acceleration module is configured to:
receive
a plurality of feature maps based on image data, each feature map having a first location storing a first feature value based on one or more regions of the image data, wherein each feature map stores one or more feature values for a different channel of the image data, and wherein a first set of associated feature values includes the first feature value stored at the first location within each of the plurality of feature maps;
determine an argument maxima value for the first set of associated feature values, wherein the argument maxima value is determined by executing a sequence of the hardware-implemented operations on the first set of associated feature values; and
generate an argument maxima map storing the argument maxima value determined for the first set of associated feature values.

6. The hardware acceleration module of claim 5, wherein the hardware-implemented operations implemented by the hardware acceleration module include at least a convolution operation, a rectified linear unit (ReLU) activation operation, and a layer concatenation operation.

7. The hardware acceleration module of claim 6, wherein the hardware acceleration module is configured to operate with fixed-point number representations.

8. The hardware acceleration module of claim 6, wherein the hardware acceleration module is further configured to transmit the argument maxima map to a central processing unit (CPU) comprising a separate set of hardware from the hardware acceleration module.

9. The hardware acceleration module of claim 5, wherein determining the argument maxima value for a first set of associated feature values stored at the first location within each of the plurality of feature maps comprises:
using a first sequence of the hardware-implemented operations implemented by the hardware acceleration module, to determine a maximum of the first set of associated feature values; and
using a second sequence of the hardware-implemented operations implemented by the hardware acceleration module, to determine a first argument maxima value corresponding to the determined maximum of the first set of associated feature values.

10. The hardware acceleration module of claim 9, wherein the first sequence of hardware-implemented operations used to determine the maximum of the first set of associated feature values comprises:
performing a first hardware-implemented convolution operation, with fixed weights, on two feature values within the first set of associated feature values, to generate a first set of outputs;
applying a hardware-implemented ReLU activation operation to the first set of outputs, to generate a second set of outputs;
performing a hardware-implemented concatenation operation on the second set of outputs and the two feature values, to generate a third set of outputs; and
performing a second hardware-implemented convolution operation to sum the third set of outputs and divide the sum by two.

11. The hardware acceleration module of claim 10, wherein determining the maximum of the first set of associated feature values comprises performing the first sequence of hardware-implemented operations a number of times depending on the number of feature values within the first set of associated feature values.

12. The hardware acceleration module of claim 11, wherein the second sequence of operations used to determine the first argument maxima value corresponding to the determined maximum of the first set of associated feature values comprises:
performing a hardware-implemented concatenation operation on the first set of feature values and the determined maximum of the first set of feature values, to generate a fourth set of outputs;
performing a third hardware-implemented convolution operation to subtract the determined maximum of the first set of associated feature values from, and add a positive constant value, each of first set of associated feature values, to generate a fifth set of outputs;

applying a hardware-implemented ReLU activation operation to the fifth set of outputs, to generate a sixth set of outputs; and performing at least a fourth hardware-implemented convolution operation on the sixth set of outputs, in which each particular output of the sixth set of outputs is multiplied by two to the power of an index value associated with the particular output, to generate a seventh set of outputs, and in which the seventh set of outputs is summed to calculate the first argument maxima value.

13. A method comprising:

receiving, at a hardware acceleration module, a plurality of feature maps based on image data, each feature map having a first location storing a first feature value based on one or more regions of the image data, wherein each feature map stores one or more feature values for a different channel of the image data, and wherein a first set of associated feature values includes the first feature value stored at the first location within each of the plurality of feature maps;

determining, by the hardware acceleration module, an argument maxima value for the first set of associated feature values, wherein the argument maxima value is determined by executing a sequence of hardware-implemented operations on the first set of associated feature values; and generating, by the hardware acceleration module, an argument maxima map storing the argument maxima value determined for the first set of associated feature values.

14. The method of claim 13, wherein the hardware-implemented operations implemented by the hardware acceleration module include at least a convolution operation, a rectified linear unit (ReLU) activation operation, and a layer concatenation operation.

15. The method of claim 14, wherein the hardware acceleration module is configured to operate with fixed-point number representations.

16. The method of claim 14, further comprising transmitting the argument maxima map to a central processing unit (CPU) comprising a separate set of hardware from the hardware acceleration module.

17. The method of claim 13, wherein determining the argument maxima value for a first set of associated feature values stored at the first location within each of the plurality of feature maps comprises:

using a first sequence of the hardware-implemented operations implemented by the hardware acceleration module, to determine a maximum of the first set of associated feature values; and using a second sequence of the hardware-implemented operations implemented by the hardware acceleration module, to determine a first argument maxima value corresponding to the determined maximum of the first set of associated feature values.

18. The method of claim 17, wherein the first sequence of hardware-implemented operations used to determine the maximum of the first set of associated feature values comprises:

performing a first hardware-implemented convolution operation, with fixed weights, on two feature values within the first set of associated feature values, to generate a first set of outputs;

applying a hardware-implemented ReLU activation operation to the first set of outputs, to generate a second set of outputs;

performing a hardware-implemented concatenation operation on the second set of outputs and the two feature values, to generate a third set of outputs; and performing a second hardware-implemented convolution operation to sum the third set of outputs and divide the sum by two.

19. The method of claim 18, wherein determining the maximum of the first set of associated feature values comprises performing the first sequence of hardware-implemented operations a number of times depending on the number of feature values within the first set of associated feature values.

20. The method of claim 19, wherein the second sequence of operations used to determine the first argument maxima value corresponding to the determined maximum of the first set of associated feature values comprises:

performing a hardware-implemented concatenation operation on the first set of feature values and the determined maximum of the first set of feature values, to generate a fourth set of outputs;

performing a third hardware-implemented convolution operation to subtract the determined maximum of the first set of associated feature values from, and add a positive constant value, each of first set of associated feature values, to generate a fifth set of outputs;

applying a hardware-implemented ReLU activation operation to the fifth set of outputs, to generate a sixth set of outputs; and performing at least a fourth hardware-implemented convolution operation on the sixth set of outputs, in which each particular output of the sixth set of outputs is multiplied by two to the power of an index value associated with the particular output, to generate a seventh set of outputs, and in which the seventh set of outputs is summed to calculate the first argument maxima value.

* * * * *